United States Patent
Vinson et al.

(10) Patent No.: US 8,051,671 B2
(45) Date of Patent: Nov. 8, 2011

(54) SYSTEM AND METHOD FOR COOLING COMPUTERS

(75) Inventors: Wade D. Vinson, Houston, TX (US); Christian L. Belady, Richardson, TX (US); Gerald E. Laws, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 410 days.

(21) Appl. No.: 11/242,436

(22) Filed: Oct. 3, 2005

(65) Prior Publication Data

US 2007/0074525 A1    Apr. 5, 2007

(51) Int. Cl.
*F25D 23/12*    (2006.01)

(52) U.S. Cl. .......................... 62/259.2; 62/455

(58) Field of Classification Search ............... 62/259.2, 62/178, 186, 180, 89, 434, 455; 165/80.3, 165/104.33; 361/694–696, 678; 454/184, 454/185, 186
See application file for complete search history.

(56) References Cited

U.S. PATENT DOCUMENTS

| | | | | |
|---|---|---|---|---|
| 2,932,953 A | * | 4/1960 | Becket et al. ..................... 62/3.6 |
| 3,903,404 A | * | 9/1975 | Beall et al. ................... 361/679.4 |
| 4,446,774 A | * | 5/1984 | Meckler ......................... 454/256 |
| 4,460,035 A | * | 7/1984 | Mizote et al. .................. 165/202 |
| 4,531,453 A | * | 7/1985 | Warman et al. ............... 454/139 |
| 4,665,707 A | * | 5/1987 | Hamilton ......................... 62/3.3 |
| 5,077,601 A | * | 12/1991 | Hatada et al. .................. 257/722 |
| 5,107,398 A | * | 4/1992 | Bailey ............................ 361/687 |
| 5,271,239 A | * | 12/1993 | Rockenfeller et al. ........ 62/259.2 |
| 5,505,533 A | * | 4/1996 | Kammersqard et al. ........ 312/236 |
| 5,718,628 A | * | 2/1998 | Nakazato et al. ............. 454/184 |
| 6,058,011 A | | 5/2000 | Hardt et al. |
| 6,101,459 A | | 8/2000 | Tavallaei et al. |
| 6,283,380 B1 | * | 9/2001 | Nakanishi et al. ........... 236/49.3 |
| 6,374,624 B1 | * | 4/2002 | Cholkeri et al. ................ 62/222 |
| 6,412,292 B2 | * | 7/2002 | Spinazzola et al. ............ 62/89 |
| 6,467,295 B2 | * | 10/2002 | Oh et al. ...................... 62/259.2 |
| 6,496,375 B2 | | 12/2002 | Patel et al. |
| 6,538,887 B2 | | 3/2003 | Belady et al. |
| 6,557,357 B2 | * | 5/2003 | Spinazzola et al. ............... 62/89 |
| 6,557,624 B1 | | 5/2003 | Stahl et al. |
| 6,564,858 B1 | | 5/2003 | Stahl et al. |
| 6,574,104 B2 | | 6/2003 | Patel et al. |
| 6,574,970 B2 | * | 6/2003 | Spinazzola et al. ............... 62/89 |
| 6,616,524 B2 | * | 9/2003 | Storck et al. .................. 454/184 |
| 6,628,520 B2 | | 9/2003 | Patel et al. |
| 6,643,128 B2 | * | 11/2003 | Chu et al. ...................... 361/687 |
| 6,664,492 B1 | | 12/2003 | Babb et al. |
| 6,694,759 B1 | | 2/2004 | Bash et al. |
| 6,705,389 B1 | | 3/2004 | Stahl et al. |
| 6,718,277 B2 | | 4/2004 | Sharma |
| 6,722,151 B2 | * | 4/2004 | Spinazzola et al. .......... 62/259.2 |
| 6,745,579 B2 | * | 6/2004 | Spinazzola et al. ............... 62/89 |
| 6,747,872 B1 | | 6/2004 | Patel et al. |
| 6,772,604 B2 | | 8/2004 | Bash et al. |
| 6,775,997 B2 | | 8/2004 | Bash et al. |
| 6,786,056 B2 | | 9/2004 | Bash et al. |

(Continued)

FOREIGN PATENT DOCUMENTS

JP    8-223510 A    *    8/1998

*Primary Examiner* — Mohammad Ali (57) ABSTRACT

In certain embodiments, an air-pressurizing device is positioned to discharge a computer system. A supply conduit pneumatically couples a cooled-air discharge conditioning system with an inlet of the air-pressurizing device.

29 Claims, 8 Drawing Sheets

U.S. PATENT DOCUMENTS

| | | | |
|---|---|---|---|
| 6,792,550 B2 | 9/2004 | Osecky et al. | |
| 6,813,897 B1 | 11/2004 | Bash et al. | |
| 6,817,199 B2 | 11/2004 | Patel et al. | |
| 6,826,922 B2 | 12/2004 | Patel et al. | |
| 6,832,489 B2 | 12/2004 | Bash et al. | |
| 6,832,490 B2 | 12/2004 | Bash et al. | |
| 6,834,512 B2 | 12/2004 | Bash et al. | |
| 6,834,811 B1 | 12/2004 | Huberman et al. | |
| 6,851,064 B2 | 2/2005 | Ku et al. | |
| 6,854,284 B2 | 2/2005 | Bash et al. | |
| 6,854,287 B2 | 2/2005 | Patel et al. | |
| 6,868,682 B2 | 3/2005 | Sharma et al. | |
| 6,868,683 B2 | 3/2005 | Bash et al. | |
| 6,886,353 B2 | 5/2005 | Patel et al. | |
| 6,896,612 B1 * | 5/2005 | Novotny | 454/184 |
| 6,909,606 B2 * | 6/2005 | Barsun et al. | 361/698 |
| 6,923,075 B2 | 8/2005 | Carbone et al. | |
| 6,932,696 B2 * | 8/2005 | Schwartz et al. | 454/184 |
| 6,938,433 B2 | 9/2005 | Bash et al. | |
| 6,945,058 B2 | 9/2005 | Bash et al. | |
| 6,990,817 B1 * | 1/2006 | Bhatia | 62/5 |
| 7,051,946 B2 | 5/2006 | Bash et al. | 236/49.3 |
| 7,236,359 B2 * | 6/2007 | Strobel | 361/687 |
| 2002/0108386 A1 * | 8/2002 | Spinazzola et al. | 62/259.2 |
| 2002/0126449 A1 * | 9/2002 | Casebolt | 361/687 |
| 2003/0150231 A1 * | 8/2003 | Spinazzola et al. | 62/259.2 |
| 2005/0152112 A1 * | 7/2005 | Holmes et al. | 361/695 |
| 2005/0153649 A1 * | 7/2005 | Bettridge et al. | 454/188 |
| 2005/0248043 A1 * | 11/2005 | Bettridge et al. | 261/27 |
| 2006/0118290 A1 * | 6/2006 | Klassen et al. | 165/202 |

* cited by examiner

SYSTEM AND METHOD FOR COOLING COMPUTERS

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

A computer, such as a server, is typically disposed in an air conditioned building or room. Further, an air conditioning system may be dedicated to maintaining the computer and its electronic components at acceptable operating temperatures. However, the temperature of the air near the computer (e.g., near a fan intake of a computer) may be several degrees higher than room temperature. Unfortunately, the air around the computers may be warmer than desirable due to poor flow patterns of the air conditioning, radiant or exhaust heat from the computers, and so forth. At the cost of greater energy consumption, the air conditioning system may be adjusted to lower the air temperature in the building or room to maintain the computer at acceptable operating conditions. However, the lower room temperature may not solve the problem of excess heat near the computer. For example, the heated air that exhausts from the computer may linger in close proximity to the computer, increasing the temperature of the air entering the computer and, thereby, reducing the effectiveness of forced-convection cooling within the computer.

For the case of dedicated cooling systems, such as a computer room air conditioning (CRAC) system, the associated plenum pressure-drop losses, poor hot-air recirculation, and the relatively high air-volume demand of non-homogenous racks, for example, generally result in thermal problems even with well-designed servers and server racks. Again, this poor thermal performance is often compensated for by increasing the heat transfer by the CRAC, and therefore, increasing the accompanying energy costs.

BRIEF DESCRIPTION OF THE DISCLOSED INVENTION

In certain embodiments, an air-pressurizing device is positioned to discharge close-by a computer system. A supply conduit pneumatically couples a cooled-air discharge of an air conditioning system with an inlet of the air-pressurizing device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
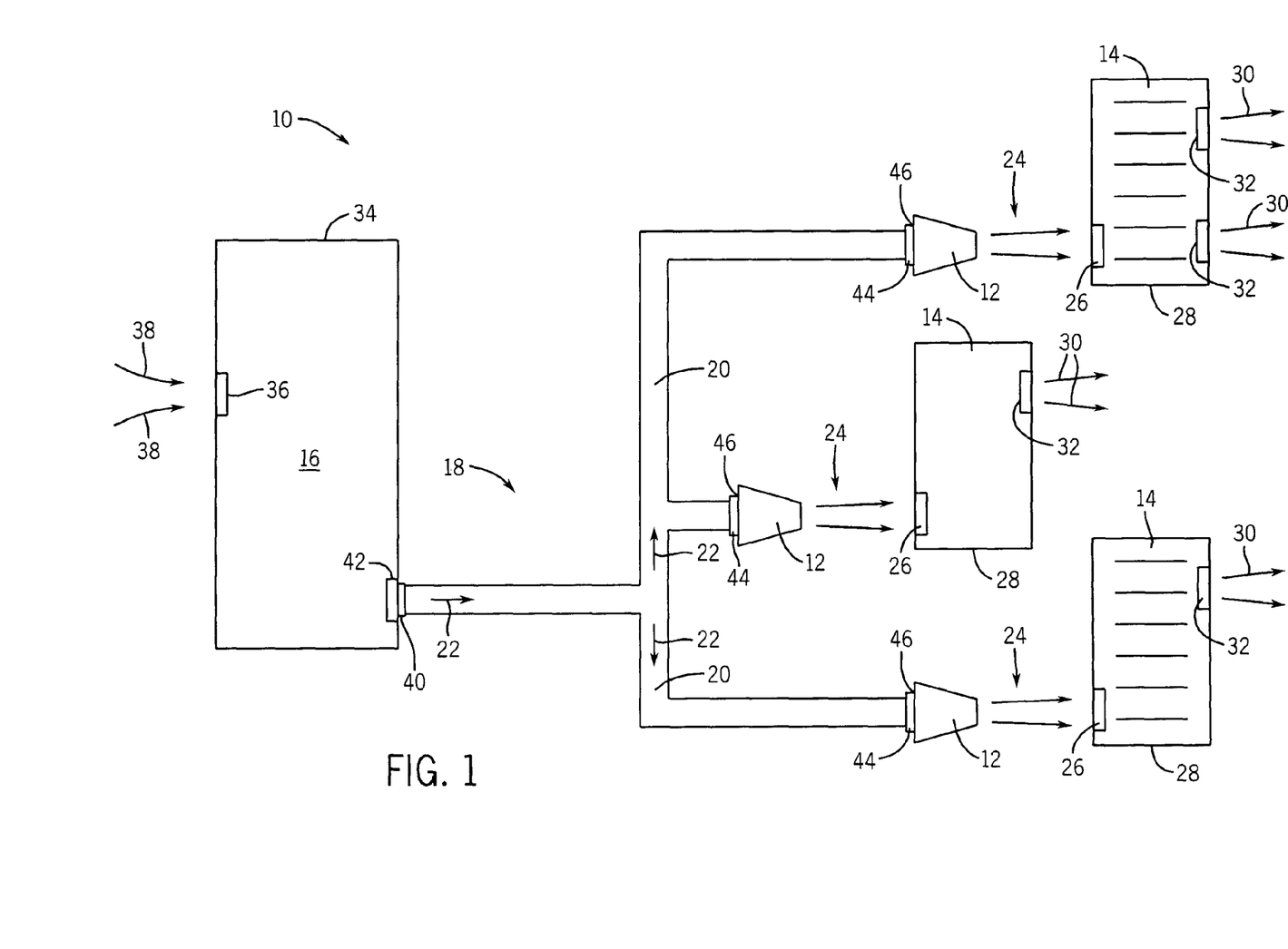
FIG. 1 is a diagrammatical representation of a cooling system for computers, the cooling system having air-pressurizing devices that move and pressurize the cool air in the vicinity of the computers in accordance with embodiments of the present invention.

FIG. 1 illustrates an exemplary air cooling system 10 that utilizes air-pressurizing devices 12 to cool one or more computer systems 14 in accordance with certain embodiments of the present invention. The cooling system 10 also includes an air conditioning system 16 and a supply conduit 18 that pneumatically couples the air conditioning system 16 to the air-pressurizing devices 12. If multiple air-pressurizing devices 12 are employed (e.g., in parallel) as depicted, then the illustrated supply conduit 18 incorporates a supply manifold 20. The air-pressurizing devices 12, supply conduit 18, and manifold 20 may be situated in one or more rooms including those room(s) housing the computer systems 14. These illustrated parts and other parts of the cooling system 10 may be disposed at various locations within a room, as well as within the walls, below the floor, above the ceiling of the room, and so on.

In the illustrated embodiment of FIG. 1, the air-pressurizing devices 12 are motive devices. Exemplary air-pressurizing devices 12 include air movers, fans, blowers (e.g., booster blower), compressors (e.g., axial, centrifugal, rotary, reciprocating, etc.), pumps, and so on. As depicted, the air-pressurizing devices 12 pull and compress (or pressurize) cooled air 22 exiting from the air conditioning system 16, and discharge compressed cooled air 24 in the vicinity of the computer systems 14. In this example, the compressed cooled air 24 generally equalizes at ambient (atmospheric) pressure or slightly above ambient pressure upon discharge from the air-pressurizing device 12. In general, the air-pressurizing devices 12 focus the compressed cooled air 24 in the direction and vicinity of the computer systems 14, thereby increasing the amount of cooled air 22 that surrounds and passes through the computer systems 14. In other words, the air-pressurizing devices 12 reduce the amount of intermixing of the cooled air 22 from the air conditioning system 16 with the warmer room air or exhaust air circulating from the computer systems 14. As a result, the cooling system 10 increases the temperature differential of the cooled air versus the warm computer systems 14, thereby improving heat transfer via air cooling (e.g., forced convection) within the computers 14.

In certain embodiments, the air-pressurizing devices 12 of FIG. 1 are positioned such that the compressed cooled air 24 discharges from the air-pressurizing devices 12 near an intake 26 of an enclosure 28 of the computer systems 14. Similarly, the compressed cooled air 24 may discharge adjacent a row or an aisle of the computer systems 14. Therefore, the temperature of the air near the intake 26 of the computer systems 14 is generally cooler than room temperature. Indeed, the temperature of the air near the intake 26 of the computer systems 14 may approach that of the temperature of the cooled air 22 that discharges from the air conditioning system 16. Moreover, forced convection mechanisms and other components inside the computer systems 14 may facilitate intake of cool air into the computer systems 14 and also assist in discharge of exhaust air 30 from the computer systems 14. In the illustrated embodiment, the warmer exhaust air (e.g., containing heat dissipated from components inside the computer system 14) discharges from a vent 32 disposed on the enclosure 28.

In certain configurations, the air pressurizing devices 12 are relatively larger-sized and higher-flow blowers or fans situated under a floor or above the floor near the computer systems 14. A high-pressure high-flow air moving device, for example, feeds a server intake space in the front of the rack. Optionally, an equalizing plenum or duct (not shown) disposed at the exhaust of the air-pressurizing device 12 (e.g., air mover) further spreads the cooled air 24 to servers in a rack. Alternatively or in addition, air-pressurizing devices 12 of a relatively smaller size are employed. In certain configurations, smaller-sized blowers or fans are integrated closer to the computer systems 14.

Further, as discussed below, the supply conduit 18 may be extended (on the discharge side of the air-pressurizing devices) to enclose and deliver the compressed cooled air 24 directly to the computer systems 14 (see FIGS. 2 and 3). In this embodiment, the compressed cooled air 24 may remain compressed and pressurized until it reaches the enclosures 28, which may also be operated under pressure. In further embodiments, additional air-pressurizing devices 12, a return conduit, one or more valves, and so on, may facilitate the return of exhaust air 30 from the computer systems 14 to the air conditioning system 16 (see FIGS. 4 and 5). Moreover, it should be apparent that the size and geometry of the different enclosures 28 may depend on the type of computer system 14, the particular configuration of the cooling system 10, and so on.

The computer systems 14 to be cooled may be housed in the same room, such as in a data room or server room. On the other hand, the computer systems 14 may be situated in different rooms. Exemplary computer systems 14 include servers, server racks, personal computers, and so forth. Such computer systems 14 may include dense computer systems having a compact design and employing high power, high heat generating components. It is believed that certain embodiments of the air cooling system 10 may adequately cool up to 100-kilowatt servers depending on the thermal output of the air conditioning system 16.

In general, heat within the computers 14 and surrounding room environment(s) is removed to outside of the building via the air conditioning system 16. For example, the removed heat is discharged to outside of the building via a hot air exhaust (not shown) of the air conditioning system 16. Alternatively, heat may be removed from the room via circulation of evaporated refrigerant to a condenser disposed outside of the building.

The air conditioning system 16 may be disposed in the same room as the computer systems 14 or in a different room. In certain embodiments, the air conditioning system 16 is dedicated to cooling the computer systems 14 and thus, may be defined as a computer room air conditioning system (CRAC). Generally, the air conditioning system 16 includes a refrigeration system housed within an enclosure 34. However, a portion of the refrigeration system may be distributed outside of the enclosure 34. An exemplary air conditioning system 16 has a refrigerant circuit (see FIG. 8) including a compressor, a condenser, an evaporator, and an expansion valve. However, alternate components may be employed in other embodiments of the air conditioning system 16. Further, depending on the type of refrigeration system utilized, a fan or blower may be operatively coupled with the evaporator (e.g., coils, fins, radiator, etc.). For example, a fan (see also FIG. 8) pulls air 38 through an intake 36 of the enclosure 34 and discharges the air 38 over coils of an exemplary refrigerant evaporator inside the enclosure 34 to generate the cooled air 22.

The supply conduit 18 of FIG. 1 facilitates transport of the cooled air 22 discharging from the air conditioning system 16 to the air-pressurizing devices 12. The supply conduit 18 may incorporate various branching and configurations, depending, for example, on the number and type of computers 14 being cooled. Exemplary supply conduits 18 include plenums, piping, tubing, and other types of conduits that may be employed in the delivery of air from the air conditioning system 16 to the inlets of the air-pressurizing devices 12. A connection 40 couples the supply conduit 18 to an air exit 42 of the air conditioning system 16. The connection 40 may be disposed at the surface of the enclosure 34, internal or external to the enclosure 34, or a combination thereof. In certain embodiments, air conditioning systems 16 are retrofitted to incorporate the connection 40 that couples the supply conduit 18 to the air exit 42. Further, as mentioned above, the illustrated supply conduit 18 may include a manifold 20 for distributing the cooled air 22 to multiple air-pressurizing devices 12. Moreover, downstream connections 44 couple the manifold 20 of the supply conduit 18 to the suction or low-pressure intake side 46 of the air-pressurizing devices 12. Exemplary connections 40 and 44 include flanged, screwed, welded, fastened, nailed, and other fittings.

In operation, the air cooling system 10 of FIG. 1 employs the air conditioning system 16 to draw in ambient air 38 and to discharge cooled air 22 through the supply conduit 18 to the air-pressurizing devices 12, which pressurize the cooled air 22. The air-pressurizing devices 12 direct the compressed cooled air 24 toward an intake 26 space of the computer systems 14, increasing the amount of cooled air aimed at the computer systems 14 and lowering the air temperature around the computer systems 14. In certain instances, the air cooling system 10 is an effective alternative to liquid cooling (i.e., circulation of liquid through heat transfer components within the servers) to cool high-density servers, for example. Therefore, problems (e.g., leaks, relatively high installation and maintenance costs, etc.) associated with circulating liquid through computer systems 14 such as high-density servers may be avoided. Lastly, the cooling system 10 may be employed in conjunction with other cooling systems to improve efficiency.

Figure 2:
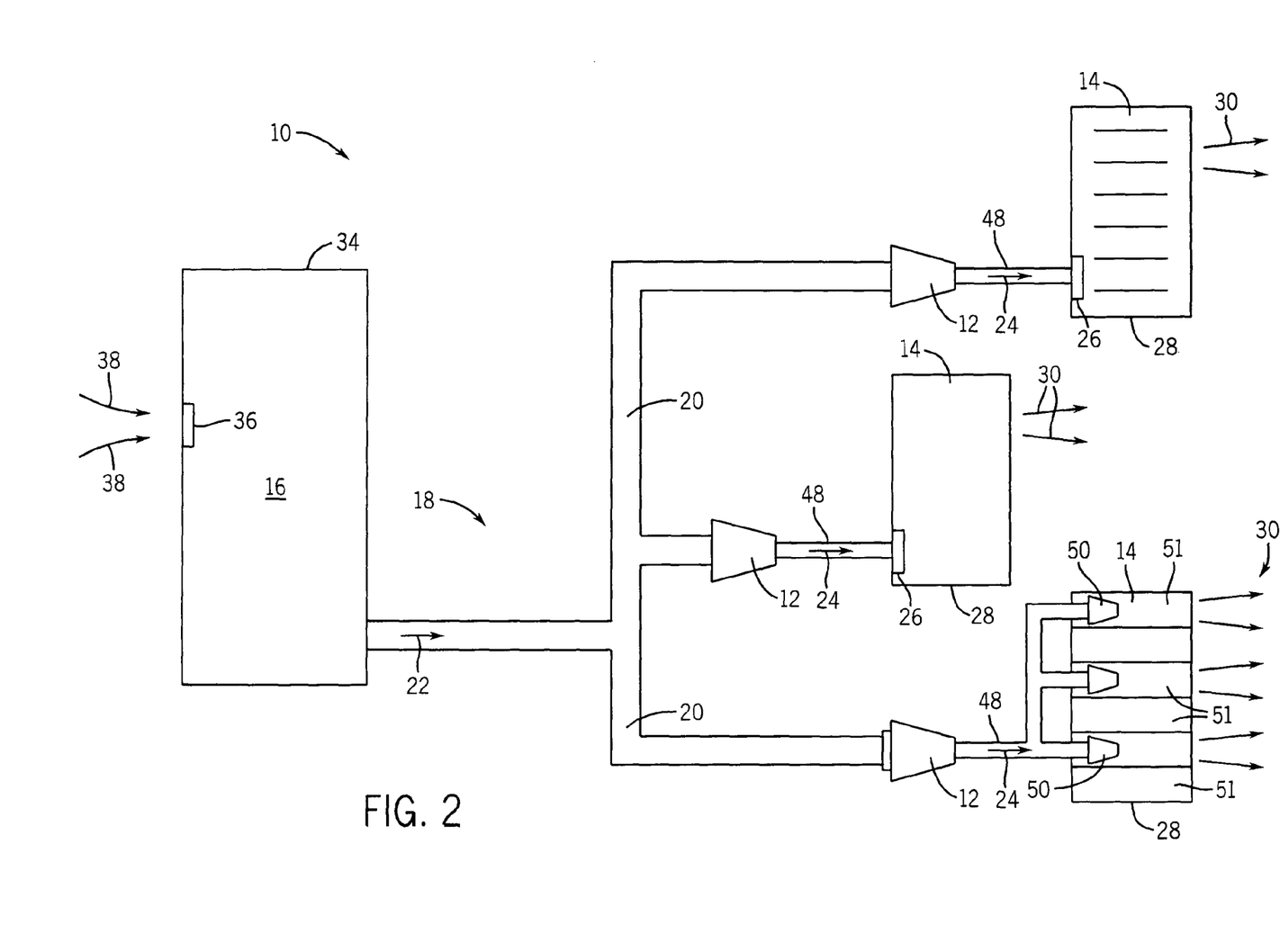
FIG. 2 is a diagrammatical representation of the cooling system of FIG. 1 having an inlet conduit coupling the discharge of the air-pressurizing devices with an enclosure of the computers in accordance with embodiments of the present invention.

FIG. 2 depicts an alternate embodiment of cooling system 10 having a supply conduit 18 comprising inlet conduits 48 coupling the discharge of the air-pressurizing devices 12 to the enclosures 28 of the computer systems 14. These inlet conduits 48 may be installed during an original installation or in a retrofit (as part of a retrofit kit, for example). Further, where an air-pressurizing device supplies compressed cooled air 24 to more than one computer system 14, the inlet conduits 48 may be constructed as a manifold (see FIG. 3). In one example, the inlet conduits 48 are standard tubing. Where the computer systems 14 are server racks, the tubing facilitates transport of the compressed cooled air 24 through an air inlet of a server, through an air inlet in a rack-door of a server rack, and so on. Further, the inlet conduits 48 may include adapter ducts and other conduits and fittings. In the illustrated embodiment, motive devices, such as additional air-pressurizing devices 50, are disposed at individual servers 51 or trays within the enclosure 28 of certain computer systems 14.

Advantageously, air recirculation hot spots in a data center or rack do not mix with the compressed cooled air 24 entering the computer systems 14. Generally, only a negligible or small temperature increase (e.g., due to any heat of compression of the air-pressurizing devices 12) is expected in the cooled air 22 flowing from the air conditioning system 16 to the computer systems 14. In other words, the temperature (e.g., 14, 15, 16, 17, 18° C.) of the compressed cooled air 24 entering the computer systems 14 is approximately the same as the temperature (e.g., 12, 13, 14, 15, 16° C.) of the cooled air 22 that discharges from the air conditioning system 16.

The air-pressurizing devices 12 and 50 are generally sized to satisfy a computer system's 14 (e.g., server's) call or demand for cool air. For example, the air-pressurizing devices 12 and 50 are sized to deliver the appropriate amount (e.g., mass) of air through the enclosures 28 of the computer systems 14, and if desired, through a return conduit (see FIG. 4). Further, the air-pressurizing devices 12 are generally sized to overcome flow resistance of the conduits (e.g., plenum pressure losses or pressure drop) and enclosure 28.

Furthermore, the enclosure 28 may be maintained under pressure (e.g., about 4 to 6 inches of water or about 0.2 pounds per square inch gauge (psig) up to 15 psig and higher), or the enclosure 28 may be operated at near ambient or atmospheric pressure. If the enclosure 28 is operated at atmospheric pressure, depressuring or decompression of the compressed cooled air 24 flowing through the enclosure 28 occurs. However, coupling of the air-pressurizing devices 12 generally facilitates operating the enclosure 28 above atmospheric or ambient pressure, thereby increasing the mass of circulating air at a given volumetric flow rate. Exemplary operating pressures of the enclosure 28 are in the range of about 14.8 pounds per square inch absolute (psia) to about 30 psia. Other exemplary ranges of operating pressure in the enclosure 28 include about 15 to 25 psia, 15 to 20 psia, 15 to 18 psia, and 15 to 16 psia.

Engineering and design factors of the air cooling system 10 generally include the temperature and volumetric flow rate, e.g., in cubic feet per minute (CFM) of the air flowing through the conduits and enclosure 28, as well as the pressure within the enclosure 28. Additional factors include the pneumatic or hydraulic resistance of the various conduits, the component density and geometry within the enclosure 28, and the amount of heat, e.g., in kilowatts or British Thermal Units (Btu) per unit time, generated by the electronic components within the enclosure 28, and other factors.

In operation, an increase in the volumetric flow rate and pressure both provide for increased mass flow of air, e.g., in pounds per hour, through the enclosure 28. An increased mass-flow rate and a lower temperature of the air entering the enclosure 28 provide for increased heat-removal capacity. Further, a lower temperature of the air provides for a greater driving force of heat transfer from the computer system 24 to the circulating air. In other words, the greater temperature differential results in greater heat transfer, e.g., forced convection. For these reasons, the air conditioning system (e.g., CRAC) output may be lowered to reduce energy consumption and associated monetary costs.

The heat removal by the circulating air from the computer system 14 may be characterized by the following equation:

$$Q = \dot{m} \times c_p \times \Delta T,$$

where Q is the duty or heat removed from the computer system 14 (and acquired by the circulating air) per unit time, $\dot{m}$ is the mass flow rate of the circulating air through the enclosure 28, $c_p$ is the specific heat capacity of air, and $\Delta T$ is the increase in temperature of the air through the enclosure 28.

The mass flow rate, $\dot{m}$, of the air may be determined by measuring the air volumetric flow rate and pressure in the enclosure 28, for example. The temperature increase or temperature difference, $\Delta T$, may be determined by measuring the inlet and outlet air temperatures of the enclosure 24. In other words, $\Delta T$ may be calculated by subtracting the temperature of the air (e.g., exhaust air 30) exiting the enclosure 28 minus the temperature of the air (e.g., cooled air 24) entering the enclosure 28.

In certain embodiments, the energy (cooling) cost is to a large extent optimized (e.g., lower cost) at substantially the same duty Q or heat removal from the computer system 14 by manipulating both the air temperature at the inlet of the enclosure 28 (and thus the $\Delta T$ of the air through the enclosure 28) and the mass flow rate of air through the enclosure 28. With such an optimization or improvement in certain embodiments, the air-cooling system 10 is designed and installed as an alternative or replacement for liquid cooling (e.g., the routing of chilled water to a rack server).

Figure 3:
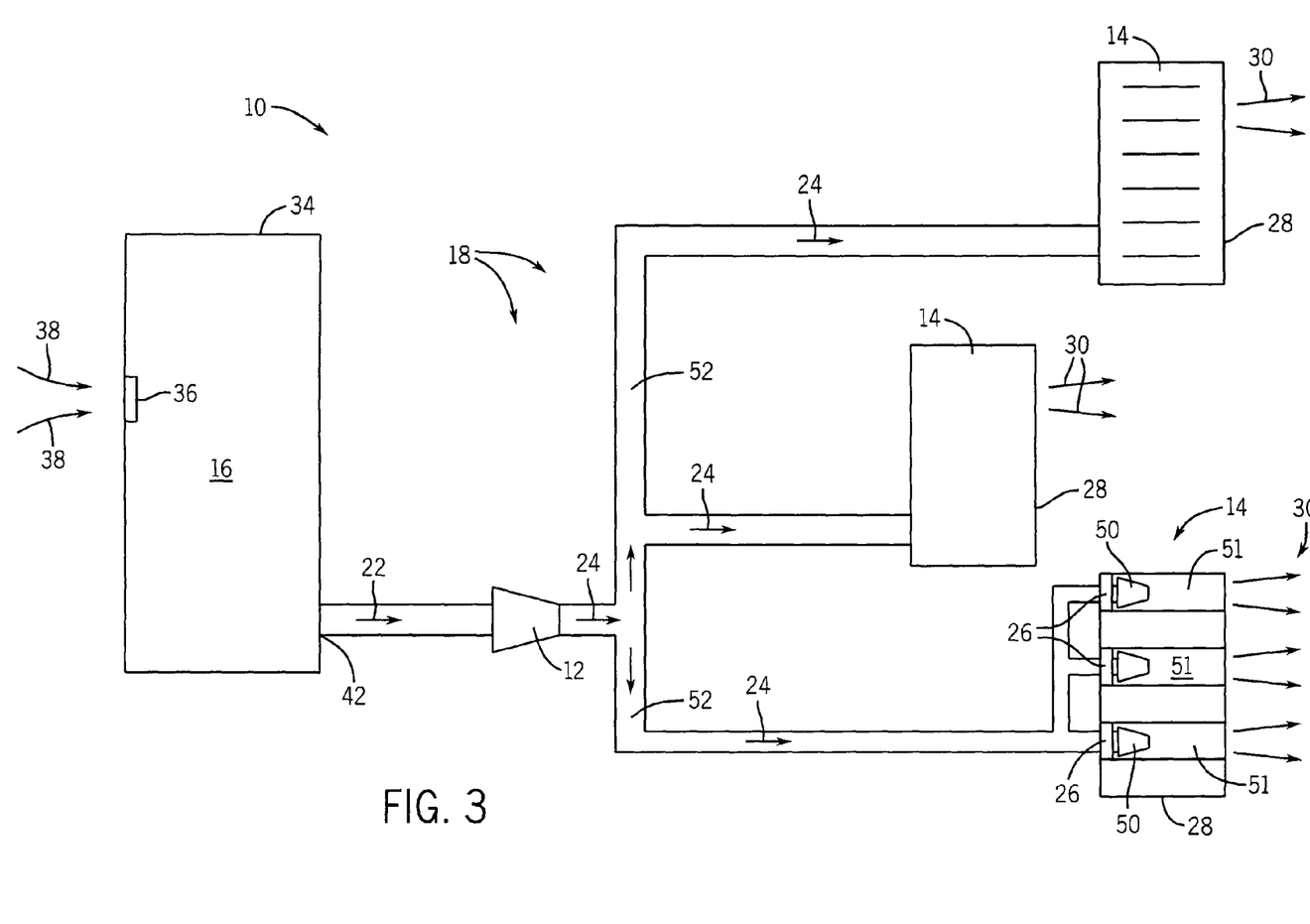
FIG. 3 is a diagrammatical representation of the cooling system of FIG. 1 with an air-pressurizing device configured to supply compressed cool air to more than one computer in accordance with embodiments of the present invention.

FIG. 3 illustrates yet another embodiment of cooling system 10 having an air-pressurizing device 12 that compresses and facilitates transport of cooled air through three computer systems 14. A manifold 52 facilitates delivery of the air from the discharge of the air-pressurizing device 12 to an inlet or intake 26 of the enclosures 28 of the three computer systems 14. In the illustrated embodiment, the manifold 52 is coupled to the enclosures 28 of the computer systems 14. In certain embodiments, at least one computer system 14 is a server rack, and smaller air-pressurizing devices 50 are disposed at the intake 26 of individual servers 51 in the server rack to deliver air to the individual servers 51.

In this example, the enclosure 28 and the components within the enclosures 28 generally withstand increased pressure. Therefore, the circulation of air within the cooling system 10 may be maintained at greater than atmospheric pressure to increase the mass of compressed cooled air 24 flowing through the enclosures 28. For pressure systems, relief devices (e.g., relief valve, rupture disc, vent panel, etc.) may be installed on a discharge portion of the air-pressurizing devices 12, on the manifold 52, and/or on the enclosures 28, and at other points in the air circuit.

Again, an increased mass flow rate and reduced temperature of the compressed cooled air 24 flowing through the enclosures 28 increases heat transfer and, therefore, advantageously increases heat dissipation from the computer systems 14. As indicated, the amount of heat removed per unit time is proportional to the mass flow rate and temperature increase of the air through the enclosure 28. The heat removed is also correlative with the temperature difference between the cooler circulating air and the warmer computer system 14.

Figure 4:
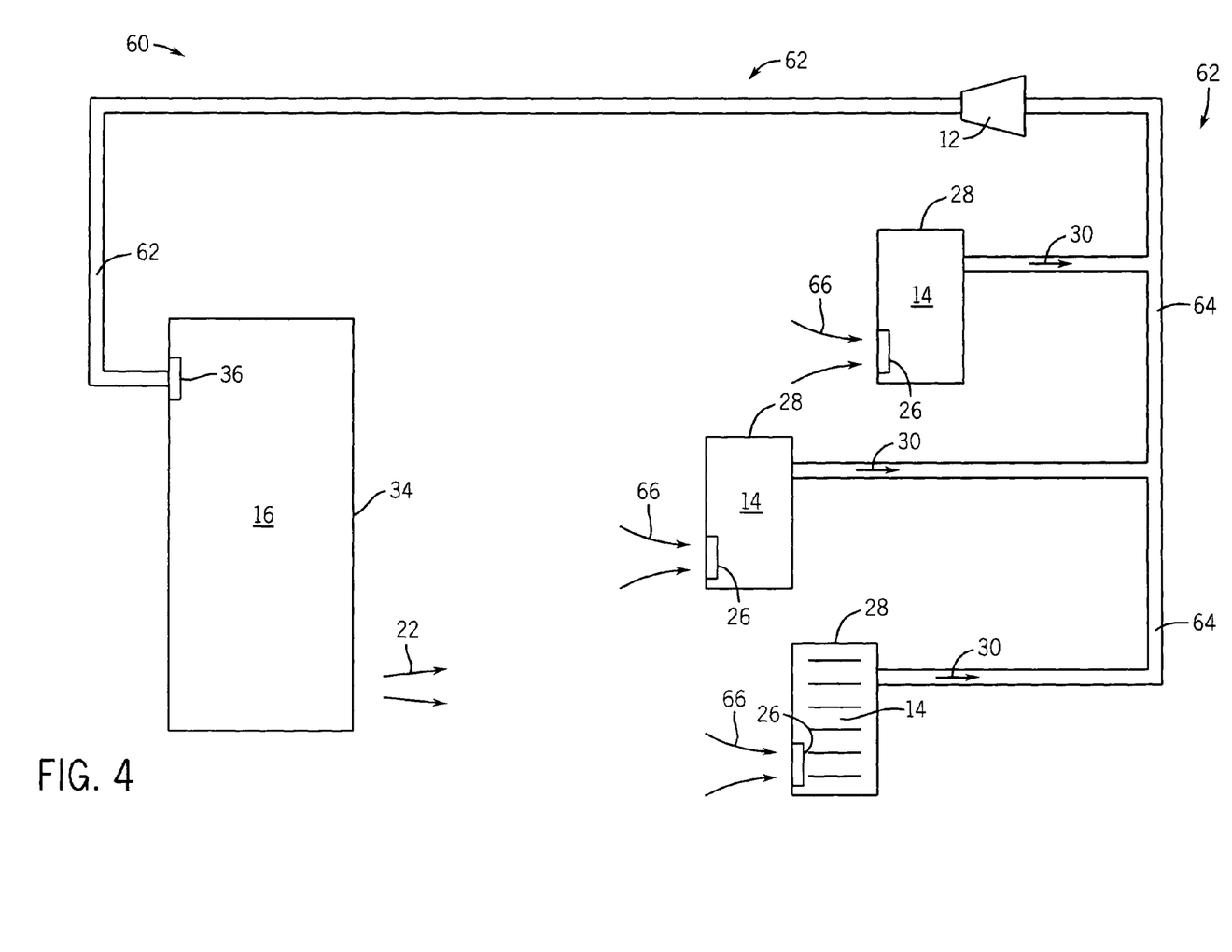
FIG. 4 is a diagrammatical representation of a cooling system for computers, the cooling system having a return conduit for transporting exhaust air from the computers in accordance with embodiments of the present invention.

FIG. 4 illustrates an air cooling system 60 having an air return system for facilitating cooling of one or more computer systems 14. The cooling system 60 includes a return conduit 62 having a return manifold 64. The return conduit 62 may contain piping, fittings, plenums, ductwork, and so on. In this example, one or more air-pressurizing devices 12 are disposed along the return conduit 62, in series and/or parallel, to facilitate return of exhaust air 30 from the computer system 14 through the return conduit 62 to the air conditioning system 16.

In the illustrated embodiment of FIG. 4, the air conditioning system 16 supplies cooled air 22 into one or more rooms (e.g., data room, server room, etc.) having the computer systems 14. The cooled air 22 may emit directly from an enclosure 34 of the air conditioning system 16, as depicted, or may be supplied via a plenum, ductwork, and so forth. The cooled air 22 may discharge from a plenum or duct, for example, from above the floor, from the ceiling, walls, or floor through a vent or grille, and so on.

In operation, ambient cooler air 66 is cooled via mixing with the cooled air 22 from the air conditioning system 16. The cooler air 66 enters the enclosures 28 of the computer systems 14 at an inlet or intake 26. Exhaust air 30 is discharged from the enclosure 28 of the computer system 14 into the return manifold 64. The return air-pressurizing device 12 receives the return air from the manifold 64 and discharges the return air through the remainder of the return conduit 62 to the inlet or intake 36 of the enclosure 34 of the air conditioning system 16. Capturing of the exhaust air 30 in a substantially closed return system may reduce the amount of intermixing of the hot exhaust air 30 with the cooler air 66 feeding the computer systems 14. Advantageously, the cooler air 66 provides a greater capacity and driving force for heat transfer within the computer systems 14. Such increases in heat transfer may promote better management of operating temperatures of the electronic components within the computer systems 14.

Figure 5:
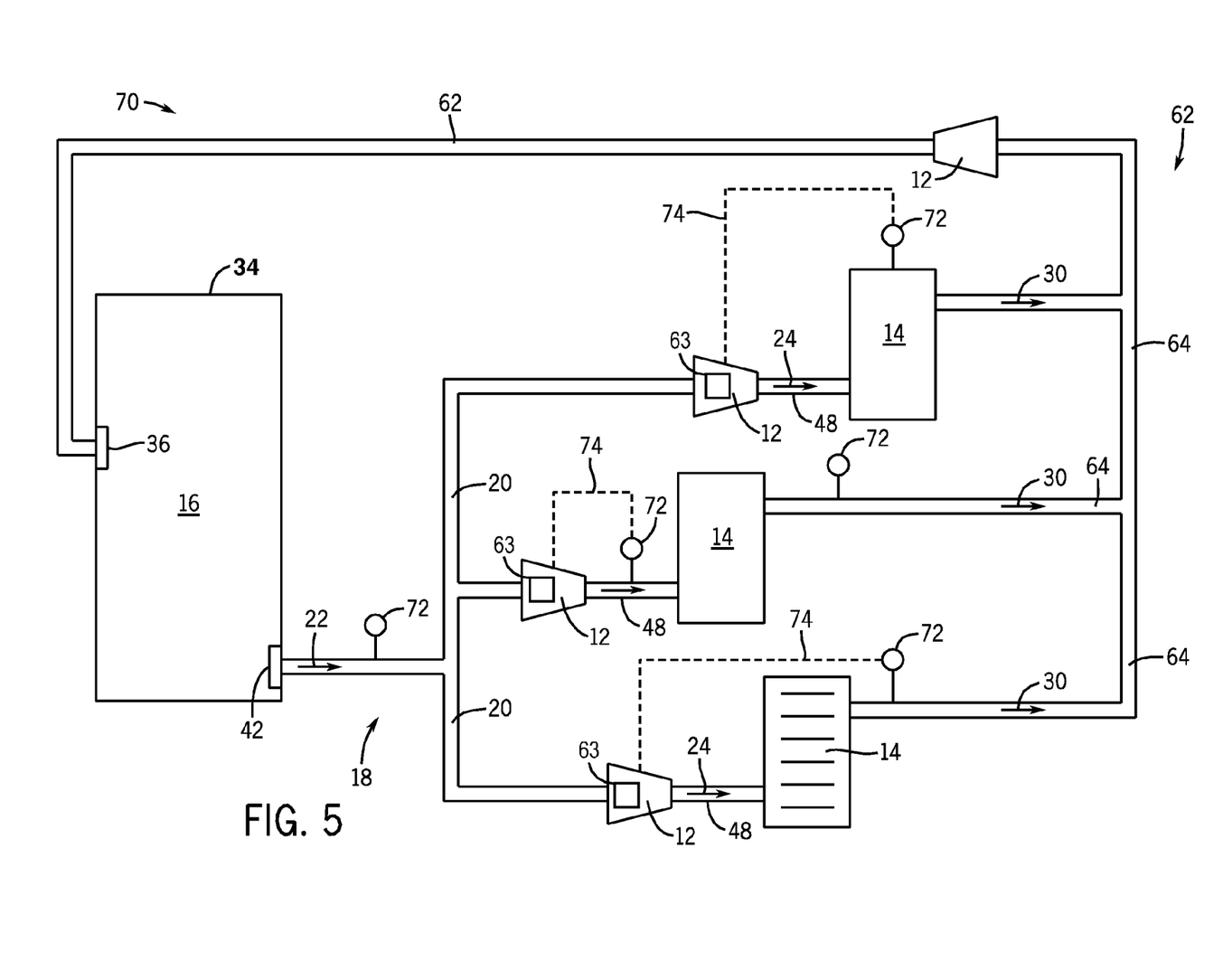
FIG. 5 is a diagrammatical representation of a cooling system for computers, the cooling system having air pressurizing devices and both a supply conduit and a return conduit in accordance with embodiments of the present invention.

FIG. 5 illustrates a cooling system 70 having both a supply conduit 18 and a return conduit 62 in accordance with embodiments of the present invention. An air conditioning system 16 supplies cooled air 22 through a discharge or air exit 42 and through the supply conduit 18. A supply manifold 20 distributes the cooled air 22 to air-pressurizing devices 12. The air-pressurizing devices 12 pull the cooled air 22 through the supply conduit 18 and deliver compressed cooled air 24 through an inlet conduit 48 to the computer systems 14 (as also depicted in FIG. 2). For the case of cooling a single computer system 14, the supply conduit 18 generally extends to the inlet of the air-pressurizing device 12 without the supply manifold 20. The return conduit 62 having a return manifold 64 (as also illustrated in FIG. 4) routes exhaust air 30 discharged from the computer systems 14 to the air conditioning system 16. Optionally, one or more air-pressurizing devices 12 may be disposed along the return conduit 62 to facilitate transport of the exhaust air 30 to the air conditioning system 16.

As mentioned, the computer systems 14 in certain embodiments are operated under pressure (e.g., up to 30 psia or higher) to increase the density and thus the mass rate of airflow through the computer systems 14. In one example, the air-pressurizing devices 12 on the supply conduit 18 act in concert with a pressure regulator or valve to maintain pressure within the computer systems 14. Such a pressure regulator or valve (i.e., backpressure regulator) may replace the air-pressurizing device 12 on the return conduit 62.

For pressurized systems, the heat of compression from the air-pressurizing devices 12 may increase the temperature of the air circulating through the computers 14. As a result, the cooled air 22 entering the computer systems 14 and the exhaust air 30 exiting the computer systems may operate at relatively higher temperatures. On the other hand, the heat of compression may be mitigated via additional cooling and/or alternative operating techniques. In one example, the air-pressurizing device 12 on the return conduit 62 is the sole or primary compressor of the circulating air and the heat of compression is removed by the air conditioning system 16. In yet another example, the air-pressurizing devices 12 on the supply conduit 18 incorporate heat exchanger(s) 63 and associated cooling mediums to remove the heat of compression from the compressed air. For instance, an isothermal compression by an air-pressurizing device 12 may be implemented via stand-alone coolers, or via integrated coolers (e.g., liquid cooling) within an assembly (e.g., skid unit or other arrangement) of the air-pressurizing device 12. Such isothermal compression systems may match or exceed the heat-transfer capability of liquid-cooling internal to a computer server.

A variety of instrumentation and control mechanisms may be installed in the cooling system 70. For example, one or more sensors 72 may be employed to measure temperature (e.g., via a thermocouple, resistance temperature detector, etc.), flow rate (e.g., via a pitot tube, orifice plate, etc.), pressure (via bourdon gauge, manometer, diaphragm, etc.), and other operating variables of the circulating air. Sensors 72 may be disposed on the supply conduit 18, enclosure 28, return conduit 62, and at other locations in the air circuit. In one example, a sensor 72 is a pressure element disposed on the enclosure 28 to measure the pressure (the pressure value used to calculate the mass of air flowing through the enclosure 28, for example). In another example, the sensors 72 are disposed on the return conduit 62 dedicated to each computer system 14, respectively, and are temperature elements that measure temperature of the circulating air.

In this latter example of a temperature sensor 72, the temperature indication or temperature value is fed via a control signal 74 to a control system used to control operation of the air-pressurizing devices 12. Such control may modulate the amount of cooled air 22 and 24 delivered to the computer systems 14 from the air-pressurizing devices 12. For example, the rotating speed (or other parameter) of an exemplary air-pressurizing device 12 may be adjusted via a variable speed controller (or other device) in response to the measured temperature (or in response to other measure variables, such as pressure or flow). Such temperature indication may also be used in the control of the air conditioning system 16, air pressure valves, air flow valves, and so forth. The control system may include a distributed control system (DCS), incorporate a programmable logic controller (PLC), and/or utilize software and hardware (e.g., processor) of the computer system 14, and so on. Lastly, it should be emphasized that a variety of other instrumentation and control techniques may be employed.

Figure 6:
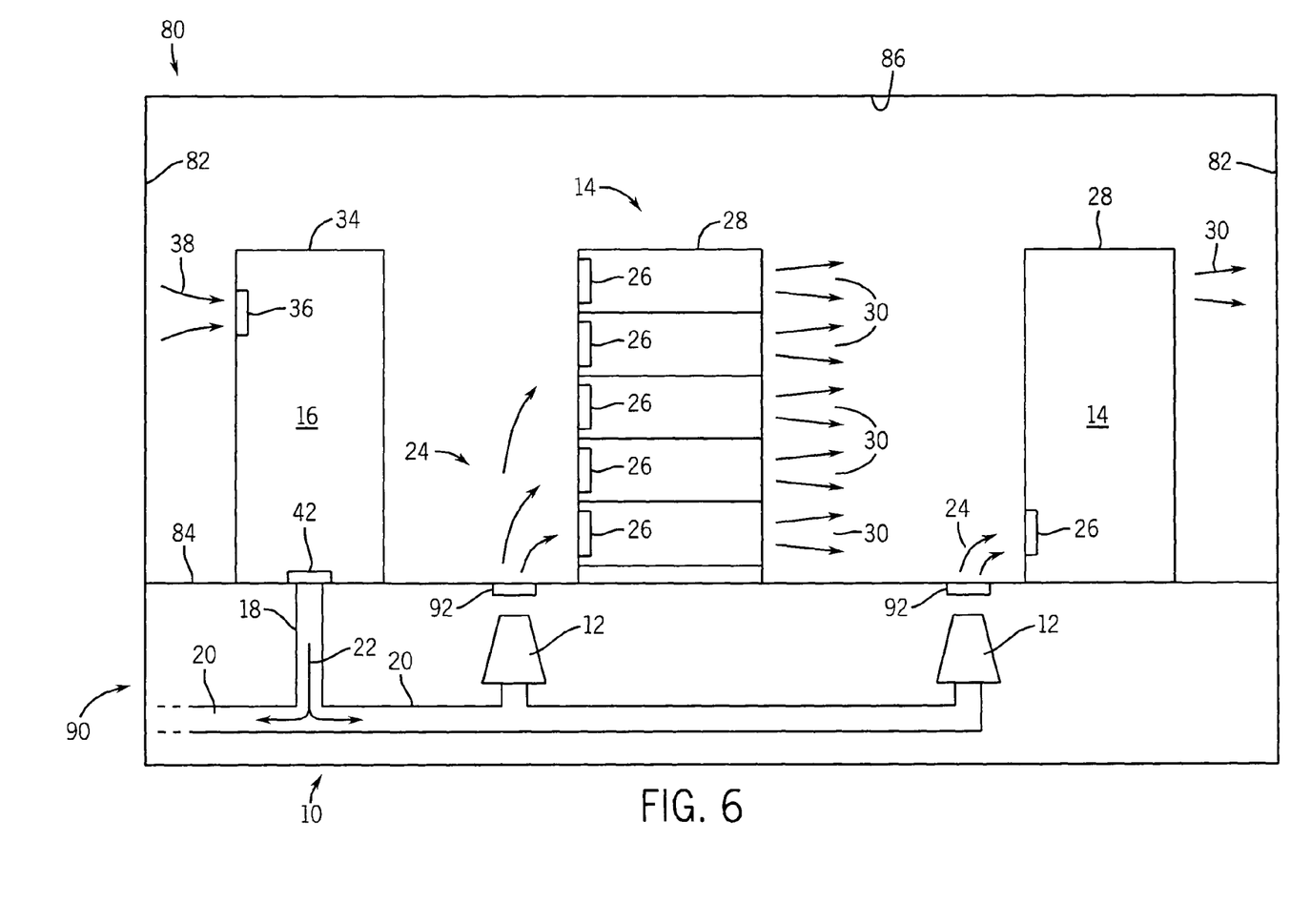
FIG. 6 is a side view of a room having a cooling system for computers in accordance with embodiments of the present invention.

FIG. 6 illustrates the cooling system 10 of FIG. 1 situated in a room 80 having walls 82, a floor 84, a ceiling 86, and an underfloor pathway 90 for routing the supply conduit 18 and positioning the air-pressurizing devices 12. One or more computer systems 14 may be disposed in the room 80. The supply conduit 18 may be disposed above the floor 84, along the walls 82, attached to the ceiling 86, and so on. Further, the air conditioning system 16 may have components disposed external to the enclosure 28 and the room 80. For example, the air conditioning system 16 may include a condensing unit disposed outside of the room 80 or associated building. As depicted, the air conditioning system 16 is disposed in the same room 80 as the computer systems 14 in which it is cooling. However, in certain configurations, the air conditioning system 16 is disposed in a room separate from the computer systems 14. Lastly, the supply conduit 18 may branch into a manifold 20 to supply computer systems in different regions of the room 80 or in different rooms.

In operation, cooled air 22 is supplied to the computer systems 14 via supply conduit 18. In the illustrated embodiment, two of the three computer systems 14 of FIG. 1 are disposed in the room 80. Cooled air 22 travels through the supply conduit 18 and enters the suction or inlet side of air-pressurizing devices 12, where the air is pressurized or compressed. The compressed air is ejected through the discharge of air-pressurizing devices 12 through floor vents or grilles 92 into the intake 26 area or space of the computer systems 14. Exemplary intakes 26 include openings, slots, louvers, grilles, and so on, in the enclosure 28. The compressed cooled air 24 enters the enclosures 28 of the computer systems 14 to cool electronic components within the computer system 14. The exhaust air 30 including heat collected from the computer systems 14 discharges from the enclosure 28 into the room 80, where the exhausted air returns to the intake 36 of the air conditioning system 16 or another air conditioning system.

Again, a variety of connection and piping arrangements may be employed. For example, in an alternate embodiment, an air intake 26 is disposed on the bottom of the enclosure 28 of the computer system 14 and mates with an opening (e.g., vent or grille 92) in the floor 84. Therefore, in this alternate embodiment, the computer system 14 sits atop the opening 92 in the floor 84 to receive the compressed cooled air 24 discharging from the air-pressurizing device 12 situated beneath the floor 84. In other words, a computer system 14 would sit atop an opening in the floor 84, as is illustrated for the air conditioning system 16 in FIG. 6, except air would flow into the computer system 14.

Figure 7:
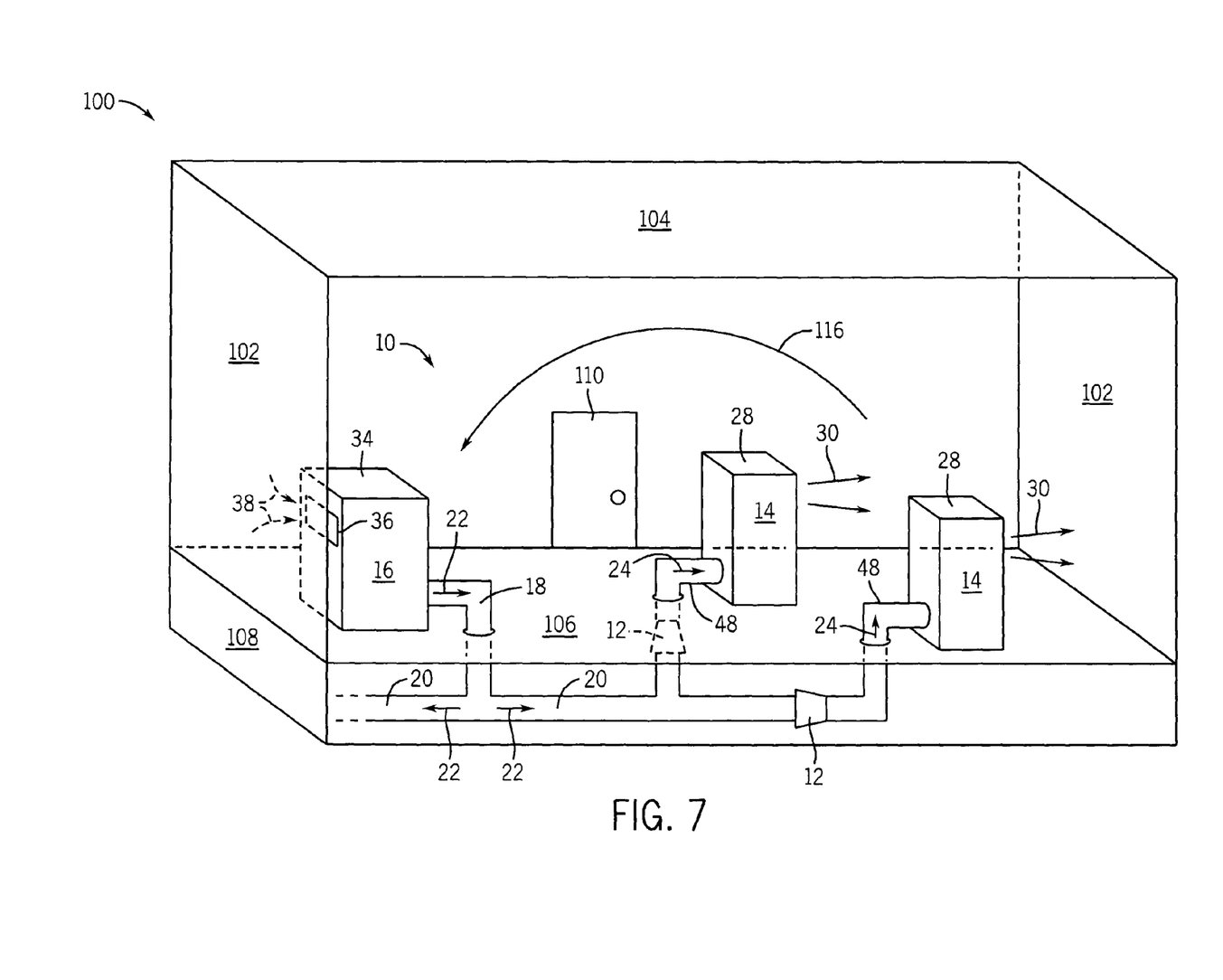
FIG. 7 is a perspective view of a room having a cooling system for computers in accordance with embodiments of the present invention.

FIG. 7 illustrates a room 100 housing at least a portion of cooling system 10 depicted in FIG. 2. The room 100 has walls 102, a ceiling 104, a floor 106, and a sub-floor pathway 108. In the illustrated embodiment, an air conditioning system 16 and two computer systems 14 are disposed within the room 100. For illustration purposes, a door 110 is depicted. Further, the sub-floor pathway 108 may house at least a portion of the supply conduit 18 and at least a portion of the supply manifold 20, as well as house the air-pressurizing devices 12. However, it should be noted that the air-pressurizing devices 12, as well as the supply conduit 18 and manifold 20 may be disposed above the floor 106.

In addition, an inlet conduit 48 couples the discharge of the air-pressurizing device 12 to the enclosure 28 of the computer systems 14. A portion of the inlet conduit 48 is disposed under the floor 106, enters into the room 100, and is coupled to the enclosure 28 In this example, the enclosure 28 (e.g., at an intake 26 depicted in FIG. 6) may include one or more connection fittings for coupling to the inlet conduit 48, and an open area for allowing air into the enclosure 28 from the conduit 48. Lastly, while the conduits are depicted as substantially cylindrical, these and other conduits and manifolds may be substantially square, rectangular, irregular, and other geometries.

In operation, cooled air 22 discharges from air conditioning system 16 through supply conduit 18 and through the supply manifold 20 to the air-pressurizing devices 12. The cooled air 22 is then compressed in air-pressurizing device 12 and pressurized to the enclosure 28 of the computer system 14 via the inlet conduit 48. The compressed cooled air 24 enters the enclosure 28 of the computer systems 14 to cool the components within the computer system 14. Heated exhaust air 30 exits the enclosure 28 and discharges into the room 100. As indicated by reference numeral 116, the heated exhausted air 30 may then recirculate through the room 100 to the intake 36 of the air conditioning system. In alternate embodiments where the air conditioning system 16 is not disposed within the room 100, the exhausted air 30 may simply mix with other sources of cooled air in the room 100.

Figure 8:
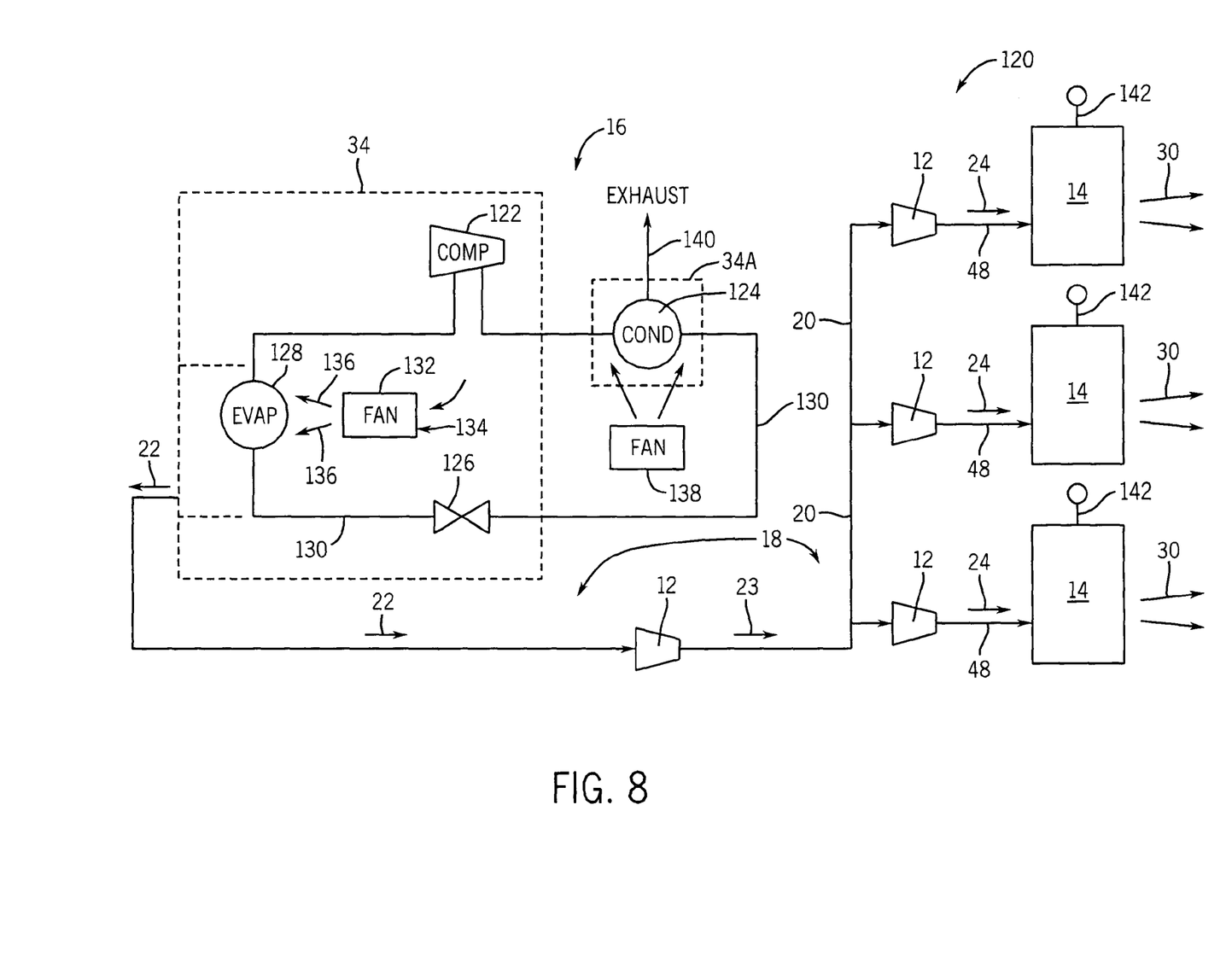
FIG. 8 is a process flow diagram of a cooling system for computers, the cooling system having an air conditioner.

FIG. 8 is a simplified process flow diagram showing a cooling system 120 having an exemplary air conditioning system 16 having a refrigerant compressor 122, a refrigerant condenser 124, an expansion valve 126, and a refrigerant evaporator 128 fluidly coupled via a refrigerant conduit 130. As discussed, the various components of the air conditioning system 16 may be disposed within the enclosure 34, or one or more of the components may be disposed in separate enclosures. The refrigerant may be fluorocarbons, ammonia, fluorocarbon-substitutes, and the like.

In the illustrated embodiment, the condenser 124 is situated in a separate enclosure 34A. Exemplary condensers 124 include coils, radiators, fins, and shell-and-tube heat exchangers. Cooling mediums for the condensation of refrigerant include air, water, glycol, and so forth. Additional equipment and unit operations (e.g., cooling tower) may also be employed to facilitate condensation of the refrigerant. Where the condenser 124 is housed in the same enclosure 34 as other components of the air conditioning system 16, an exhaust 140 may discharge from the enclosure 34 to a location external to the room. In the illustrated example, a fan 138 is situated adjacent the condenser (e.g., coils, radiator, and so on). The fan blows ambient air over the condenser to condense the refrigerant flowing through the condenser. The exhaust 140 includes hot air or warmer air discharged from around the condenser 124. As indicated, the exhaust 140 may be discharged to an external room or to the ambient environment. In contrast, as indicated, the condenser 124 may be integrated with a chilled water or glycol system, for example, where the condenser is a shell and tube heat exchanger, and/or other type of heat exchanger.

Further, a fan 132 may be disposed adjacent the evaporator 128 to intake air 134 from one or more rooms and blow the air 136 over or through the evaporator 128 to generate the cooled air 22 flowing through supply conduit 18. In operation, the exemplary evaporator 128 removes heat from the air to lower the temperature of the air. This heat is consumed as latent heat in the evaporation of the refrigerant within the evaporator at substantially-constant temperature.

In the illustrated embodiment, both parallel and series air-pressurizing devices 12 deliver cooled air 24 to the computer systems 14. For example, the air-pressurizing device 12 disposed on the supply conduit 18 is in series with the air-pressurizing devices 12 installed on the inlet conduits 48. Further, as illustrated, the air-pressurizing devices 12 installed in the inlet conduits 48 operate parallel to each other. Exemplary air-pressurizing devices 12 include an air mover, a blower, a rotary blower, a booster blower, a plenum booster, a fan, a rotary fan, a centrifugal fan, an axial fan, a compressor, a reciprocating compressor, a pump, or a motive device, or any combination thereof.

Initially, a common air-pressurizing device 12 boosts the pressure of the cool air 22 toward the computer systems 14. The discharged air 23 enters the supply manifold 20, where the air is further compressed in dedicated air-pressurizing devices 12 situated near computer systems 14. The cooled compressed air 24 then enters the computer systems 14 via inlet conduits 48. Heated exhaust air 30 may then discharge from the computer systems 14.

Lastly, sensors 142 (e.g., pressure, flow, temperature, etc.) are situated on or within the computer systems 14 (e.g., on or within an enclosure of a computer system 14), or in the conduits or manifold. The flow rate, pressure, and temperature of the circulating air, as well as the static pressure within the computer systems 14, may be adjusted in response to data or information generated by the sensors 142. In other words, operating conditions of the associated air-pressurizing devices 12, air conditioning system 16 (e.g., set-point temperature), control valves (e.g., pressure regulator), coolers (e.g., integrated with the air-pressurizing devices 12), and so on, may be adjusted in response to the measured data.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A system, comprising:
   an air conditioning system comprising an air intake, a cooled air discharge, and a fan between the air intake and the cooled air discharge;
   a plurality of computer systems comprising a first computer system and a second computer system, each of the first computer system and the second computer system comprising an enclosure, a plurality of electronic components located within the enclosure and at least one intake opening extending through the enclosure;
   a supply conduit pneumatically coupling the cooled air discharge of the air conditioning system directly with the intake opening of the first computer system and with the intake opening of the second computer system, wherein the supply conduit comprises a manifold having a plurality of air inlets, or a plurality of air exits, or a combination thereof; and a first air-pressurizing device located within the supply conduit pneumatically between the cooled air discharge of the air conditioning system and the intake opening of the first computer system, wherein the first air-pressurizing device comprises a heat exchanger.

2. The system of claim 1, comprising a sensor configured to measure flow rate, or temperature, or pressure, or any combination thereof, within the supply conduit, or within the enclosure of the first computer system, or a combination thereof, the system further comprising a control system configured to adjust a rate of the airflow from the first air-pressurizing device in response to the sensor measurement.

3. The system of claim 1, wherein the air conditioning system comprises a refrigerant circuit having a refrigerant in a closed loop.

4. The system of claim 1, wherein the air conditioning system comprises a working fluid that flows through a radiator, and the fan is configured to flow air outside of the radiator.

5. The system of claim 1, wherein the air conditioning system comprises a closed loop that circulates a working fluid through a compressor, a condenser, an expansion valve, and an evaporator.

6. The system of claim 1, wherein the first air-pressurizing device comprises an air compressor.

7. The system of claim 1, wherein the first air-pressurizing device is configured to flow air through the first computer system at an elevated pressure of at least 0.2 pounds per square inch gauge (psig).

8. The system of claim 1 and further comprising:
   a second air-pressurizing device located within the supply conduit pneumatically between the cooled air discharge of the air conditioning system and the intake opening of the second computer system.

9. The system of claim 8 wherein the first air-pressurizing device and the second air pressurizing device are configured in a parallel arrangement.

10. The system of claim 8 and further wherein:
    the manifold comprises a first manifold conduit configured in a parallel arrangement with a second manifold conduit;
    the first manifold conduit is pneumatically located between the cooled air discharge of the air conditioning system and the intake opening of the first computer system; and
    the second manifold conduit is pneumatically located between the cooled air discharge of the air conditioning system and the intake opening of the second computer system.

11. The system of claim 10 and further wherein:
    the first air-pressurizing device is located along the first manifold conduit; and
    the second air-pressurizing unit is located along the second manifold conduit.

12. The system of claim 10 and further wherein:
    each of the first computer system and the second computer system further comprises an outlet opening extending through the enclosure; and
    a first portion of air that has traveled through the first manifold conduit does not mix with a second portion of air that has traveled through the second manifold conduit at least until the first portion of air has exited through the outlet opening of the first computer system and the second portion of air has exited through the outlet opening of the second computer system.

13. The system of claim 1, comprising a second air-pressurizing device located in the enclosure of the first computer system.

14. A system, comprising:
    a computer system having an enclosure;
    an air-pressurizing device separate from the enclosure and having a discharge positioned at least adjacent an air intake of the enclosure of the computer system;
    a supply conduit configured to facilitate transport of cooled air from an air conditioning system to an inlet of the air-pressurizing device, wherein the air-pressurizing device is independent from a fan of the air conditioning system; and
    wherein the air-pressurizing device further comprises a heat exchanger.

15. The system of claim 14, comprising an inlet conduit pneumatically coupling the discharge of the air-pressurizing device directly to an inlet of the enclosure of the computer system.

16. The system of claim 14, comprising a return conduit configured to transport air from an exhaust of the computer system toward an intake of the air conditioning system.

17. The system of claim 16, wherein a first end of the return conduit is coupled directly to the exhaust of the computer system and a second end of the return conduit is coupled directly to the intake of the air conditioning unit.

18. The system of claim 16, comprising an additional air-pressurizing device disposed along the return conduit.

19. The system of claim 16, comprising a pressure sensor, or a flow sensor, or a temperature sensor, or any combination thereof, disposed in the supply conduit, or in the enclosure, or in the return conduit, or any combination thereof.

20. The system of claim 19, wherein the pressure sensor, or the flow sensor, or the temperature sensor, or any combination thereof, is operatively coupled to the air-pressurizing device to facilitate control of the air-pressurizing device.

21. The system of claim 14, wherein the air-pressurizing device is configured to flow air through the enclosure at an elevated pressure of at least 15 pounds per square inch absolute (psia).

22. The system of claim 14 and further wherein:
the air-pressurizing device generates heat due to compression of air; and
wherein the heat exchanger incorporates a cooling medium capable of removing at least a portion of the heat.

23. The system of claim 14, wherein the supply conduit comprises a manifold having a plurality of air inlets, or a plurality of air exits, or a combination thereof.

24. The system of claim 14, comprising a second air-pressurizing device located in the enclosure.

25. A method, comprising:
transporting cooled air via at least one fan from an air conditioning system to one or more positions at least close-by one or more inlets of a computer system;
pressurizing the cooled air with at least one air-pressurizing device located downstream of the fan of the air conditioning system and upstream of the computer system; and
wherein the air-pressurizing device comprises a heat exchanger, and wherein the air-pressurizing device is external to the air conditioning system and the computer system.

26. The method of claim 25, wherein transporting comprises ducting the cooled air directly into an enclosure of the computer system to remove heat from electronic components in the computer system.

27. The method of claim 25, comprising pressurizing and transporting warm air exhausted from the computer system directly from the computer system to an intake of the air conditioning system.

28. The method of claim 25 and further wherein:
the air-pressurizing device generates heat due to compression of air; and
wherein the heat exchanger incorporates a cooling medium capable of removing at least a portion of the heat.

29. The method of claim 25, wherein transporting the cooled air via at least one fan from the air conditioning system to one or more positions comprises transporting the cooled air via a manifold having a plurality of air inlets, or a plurality of air exits, or a combination thereof.

* * * * *